United States Patent
Aiello et al.

(10) Patent No.: US 7,787,113 B2
(45) Date of Patent: Aug. 31, 2010

(54) METHOD FOR OPTICALLY DETECTING AN ELECTRICAL ARC IN A POWER SUPPLY

(75) Inventors: Marc Aiello, Oakmont, PA (US); Edward Alan Cheesman, Chicora, PA (US); Xuan Zhang, Monroeville, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 227 days.

(21) Appl. No.: 11/750,628

(22) Filed: May 18, 2007

(65) Prior Publication Data

US 2007/0268482 A1    Nov. 22, 2007

Related U.S. Application Data

(60) Provisional application No. 60/801,929, filed on May 19, 2006.

(51) Int. Cl.
    *G01N 21/00* (2006.01)
(52) U.S. Cl. .................................. 356/237.1
(58) Field of Classification Search ............... 356/237.1
    See application file for complete search history.

(56) References Cited

U.S. PATENT DOCUMENTS

| | | | | |
|---|---|---|---|---|
| 4,060,708 A * | 11/1977 | Walters | ............... | 219/121.4 |
| 4,516,022 A * | 5/1985 | Lindgren | ............... | 250/227.11 |
| 4,539,480 A * | 9/1985 | Artinano et al. | ............. | 250/551 |
| 4,702,553 A * | 10/1987 | Buchmuller et al. | .......... | 385/12 |
| 4,940,933 A * | 7/1990 | Jenkins | ....................... | 324/772 |
| 4,988,861 A * | 1/1991 | Hakoun et al. | ......... | 250/227.11 |
| 5,185,686 A * | 2/1993 | Hansen et al. | ................. | 361/45 |
| 5,940,547 A * | 8/1999 | Schumacher et al. | .......... | 385/12 |
| 6,154,683 A * | 11/2000 | Kessler et al. | ............... | 700/150 |
| 6,229,680 B1 * | 5/2001 | Shea | ........................... | 361/42 |
| 6,236,548 B1 * | 5/2001 | Marmonier | ................... | 361/78 |
| 6,433,976 B1 * | 8/2002 | Phillips | ........................ | 361/42 |
| 6,772,077 B1 * | 8/2004 | Parker et al. | ................... | 702/76 |
| 6,903,357 B2 * | 6/2005 | Robb | ......................... | 250/554 |
| 7,035,068 B2 * | 4/2006 | Shea | ........................... | 361/42 |
| 2003/0057951 A1 * | 3/2003 | Brushwood | ................. | 324/380 |
| 2004/0079905 A1 * | 4/2004 | Robb | ......................... | 250/554 |
| 2007/0023618 A1 * | 2/2007 | Viehmann | .............. | 250/227.11 |

* cited by examiner

*Primary Examiner*—Roy Punnoose
(74) *Attorney, Agent, or Firm*—Filip A. Kowalewski

(57) ABSTRACT

A method for optically detecting an electrical arc in a power supply. The method includes capturing light with a light pipe, transmitting the captured light along at least a portion of a length of the light pipe, optically detecting the transmitted light with a photodetector which is optically coupled to the light pipe, generating a signal indicative of an intensity of the detected light, and determining whether the detected light is associated with an electrical arc.

18 Claims, 10 Drawing Sheets

METHOD FOR OPTICALLY DETECTING AN ELECTRICAL ARC IN A POWER SUPPLY

CROSS-REFERENCE TO RELATED APPLICATION

This application claims the priority benefit of U.S. Provisional Patent Application No. 60/1801,929, filed on May 19, 2006.

BACKGROUND

This application discloses an invention that is related, generally and in various embodiments, to a method for optically detecting an electrical arc in a power supply. The method may be utilized with a power supply having a plurality of power cells. Various embodiments of a power supply having a plurality of power cells are described, for example, in U.S. Pat. No. 5,625,545 to Hammond ("the '545 patent").

Systems for optically detecting an electrical arc are known in the art. In general, when an electrical arc occurs, the light resulting from the arc is optically detected, and the detection may be utilized to interrupt the power that is supplying the electrical arc. However, known systems for optically detecting electrical arcs are not necessarily suitable for many applications.

Known systems for optically detecting electrical arcs are generally susceptible to a single point of failure, and thus are not particularly well-suited for applications which require a particular level of redundancy. Also, in various devices, electrical arcs can occur in a variety of locations. For such a device, electrical arcs can occur in locations which are not quickly detected by known optical arc detection systems. Consequently, the detection of such arcs is often delayed, thereby allowing the arcs to cause significant damage to the device prior to their detection. In many instances, the damage is significant enough to render the device inoperable.

SUMMARY

In one general respect, this application discloses a method for optically detecting an electrical arc in a power supply. According to various embodiments, the method includes capturing light with a light pipe, transmitting the captured light along at least a portion of a length of the light pipe, optically detecting the transmitted light with a photodetector which is optically coupled to the light pipe, generating a signal which is indicative of an intensity of the detected light, and determining whether the detected light is associated with an electrical arc.

Aspects of the disclosed invention may be implemented by a computer system and/or by a computer program stored on a computer-readable medium. The computer-readable medium may comprise a disk, a device, and/or a propagated signal.

DESCRIPTION OF DRAWINGS

Various embodiments of the invention are described herein by way of example in conjunction with the following figures.

DETAILED DESCRIPTION

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Figure 1:
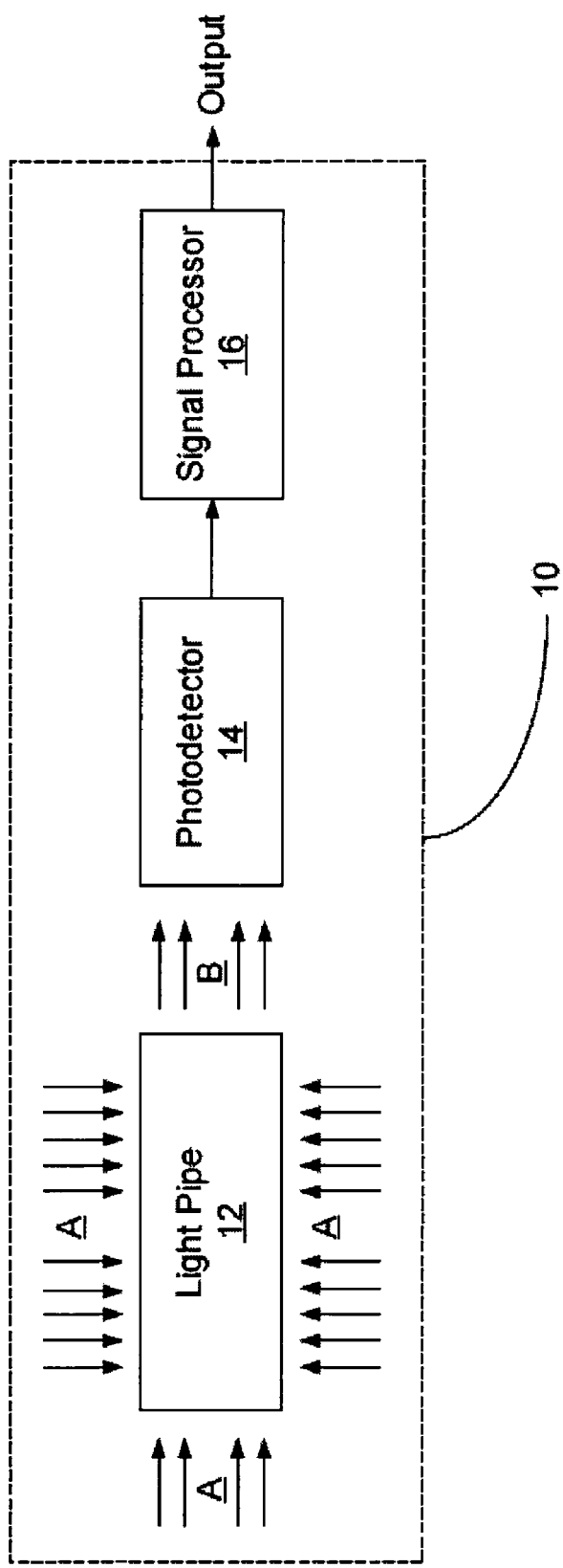
FIG. 1 illustrates various embodiments of a system for optically detecting an electrical arc.

FIG. 1 illustrates various embodiments of a system 10 for optically detecting an electrical arc. The system 10 includes a light pipe 12, a photodetector 14 optically coupled with the light pipe 12, and a signal processor 16 electrically connected to the photodetector 14. The system 10 may be utilized to optically detect an electrical arc in a variety of applications. For example, the system 10 may be utilized to optically detect an electrical arc in a power supply having a plurality of power cells. Various embodiments of a power supply having a plurality of power cells are described, for example, in U.S. Pat. No. 5,625,545 to Hammond ("the '545 patent"), which is hereby incorporated by reference in its entirety. For ease of explanation purposes, the system 10 will be described in the context of optically detecting an electrical arc in a power supply which is similar to the power supply described in the '545 patent. However, the system 10 may also be utilized to optically detect an electrical arc in applications other than a power supply.

Figure 2:
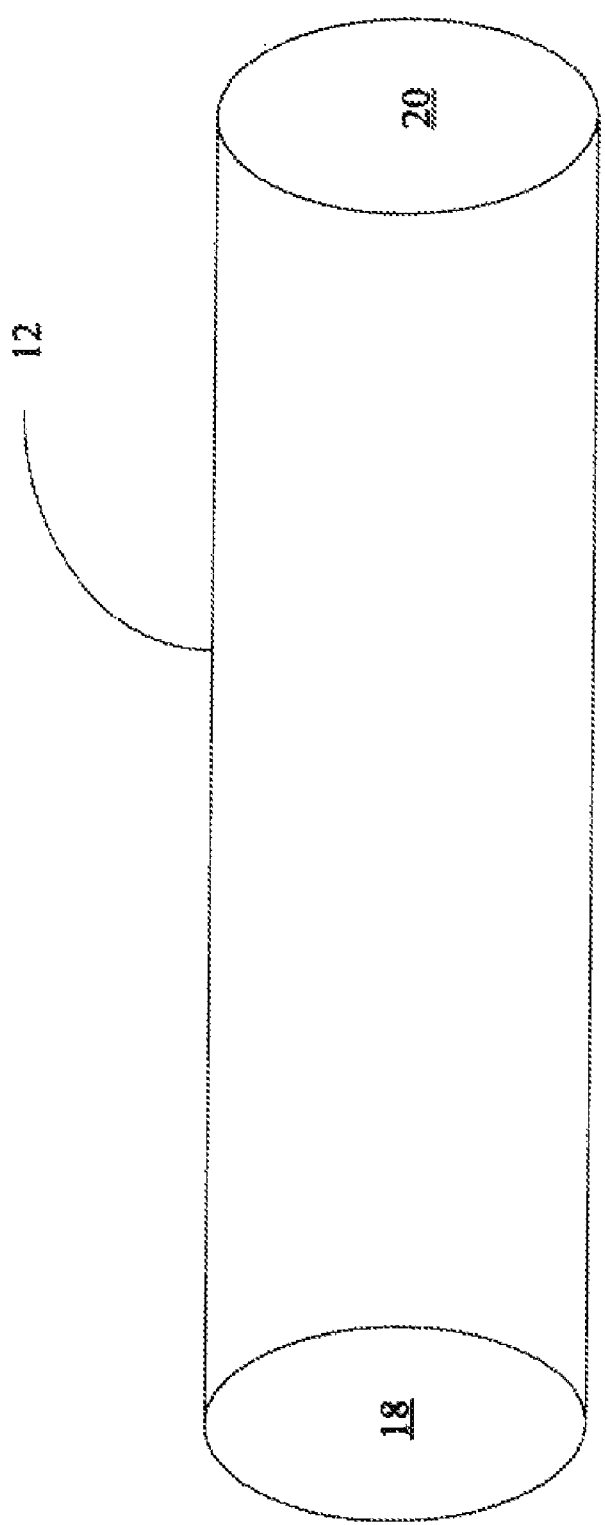
FIG. 2 illustrates various embodiments of a light pipe of the system of FIG. 1.

Various embodiments of the light pipe 12 are illustrated in FIG. 2. The light pipe 12 includes a first end 18 and a second end 20, and may be of any suitable length. According to various embodiments, the light pipe 12 is configured to capture light present at its first end 18 and transmit the captured light along the length of the light pipe 12 to its second end 20. According to various embodiments, the light pipe 12 is also configured to capture light present along its length and transmit the captured light along the length of the light pipe 12 to its second end 20. Thus, in operation, when light associated with an electrical arc is proximate any portion of the light pipe 12, the light is captured and transmitted along the length of the light pipe 12 to its second end 20.

Returning to FIG. 1, as indicated hereinabove, the light pipe 12 is optically coupled with the photodetector 14. Such optical coupling may be realized by positioning an end of the light pipe 12 (e.g., the second end 20 of the light pipe 12) proximate the photodetector 14. For applications where the second end 20 of the light pipe 12 is positioned proximate the photodetector 14 (e.g., see FIG. 2), light (represented by arrows A) captured at the first end 18 of the light pipe 12 and/or along its length is transmitted as captured light (represented by arrows B) to the photodetector 14 via the second end 20 of the light pipe 12.

The photodetector 14 may be any suitable type of photodetector. For example, according to various embodiments, the photodetector 14 is a photodiode having an anode and a cathode as is known in the art. For embodiments where the photodetector 14 is a photodiode, the photodiode may be a P-N photodiode, a P-I-N photodiode, etc., and may have a spectral range of approximately 350 to 1100 nanometers. According to other embodiments, the photodetector 14 is a phototransistor.

For some embodiments where the photodetector 14 is a photodiode, the photodiode is reverse-biased, operates in the photoconductive mode, and may generate a measurable level of dark current. For such embodiments, the cathode of the photodetector 14 is connected to a power source 22 and the anode of the photodetector 14 is connected to the signal processor 16. The power source 22 may form a portion of the system 10 or may be external to the system 10. For other embodiments where the photodetector 14 is a photodiode, the photodiode is zero-biased and operates in the photovoltaic mode. For such embodiments, the photodetector 14 is not connected to the power source 22 and the cathode of the photodetector 14 is connected to the signal processor 16.

In operation, when the photodetector 14 optically detects light associated with an electrical arc (e.g., when light associated with an electrical arc is captured by the light pipe 12 and is transmitted to the photodetector 14), the photodetector 14 generates a current which is representative of the intensity of the detected light. The generated current may include a photocurrent component and a dark current component. The photocurrent component may be considered an arc component of the generated current, and the dark current component may be considered a non-arc component of the generated current.

Figure 3:
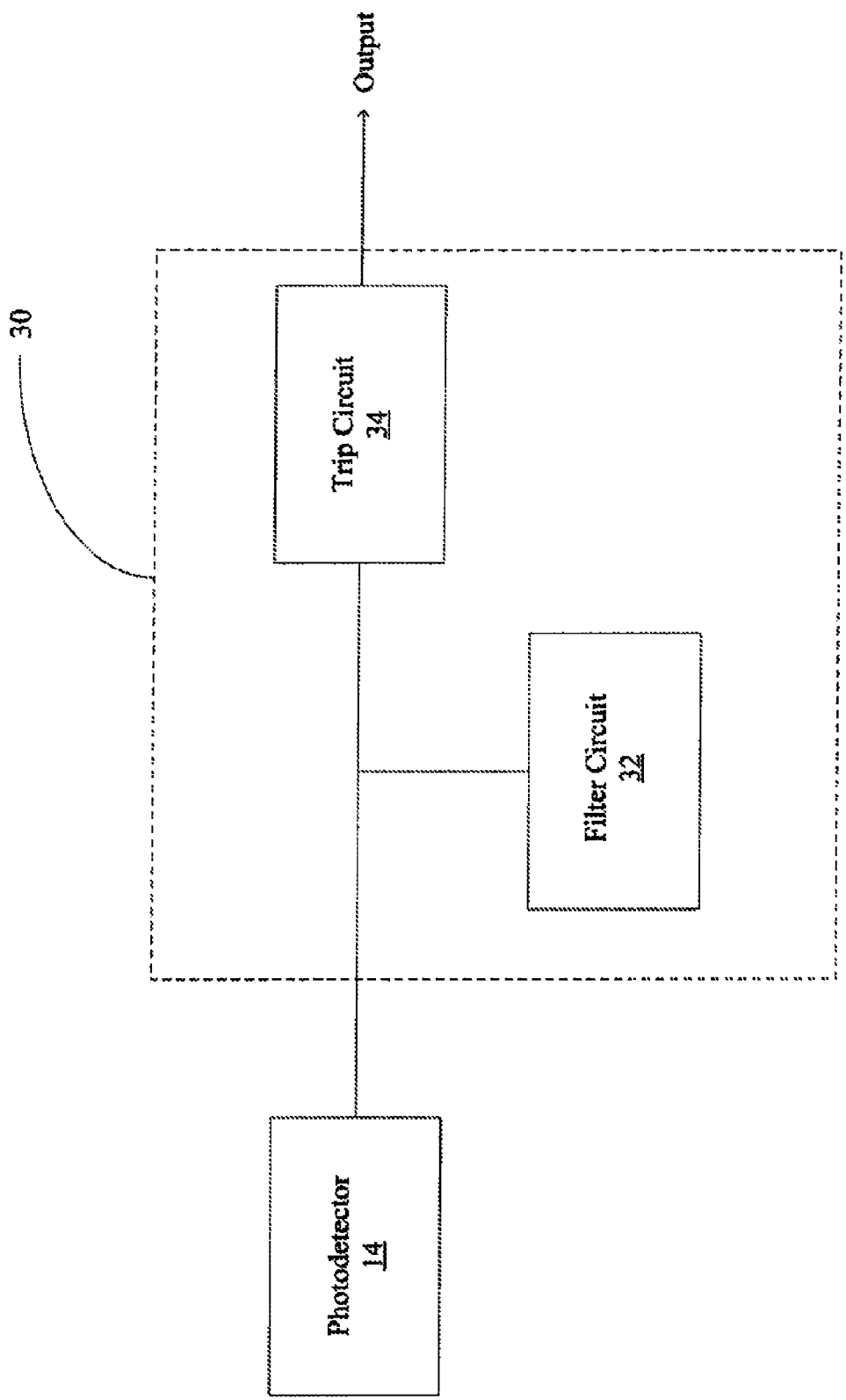
FIG. 3 illustrates various embodiments of a signal processing circuit of the systems of FIG. 1.

As indicated hereinabove, the signal processor 16 is electrically connected to the photodetector 14. The signal processor 16 may be implemented in any suitable manner. For example, according to various embodiments, the signal processor 16 is implemented as a signal processing circuit. Various embodiments of such a signal processing circuit are illustrated in FIG. 3. The signal processing circuit 30 of FIG. 3 includes an RC filter circuit 32 and a trip circuit 34 which are each electrically connected to the photodetector 14. The RC filter circuit 32 operates to remove unwanted information (e.g., information representative of the dark current component) from the signal generated by the photodetector 14. The trip circuit 34 operates to output a signal when the voltage applied to the trip circuit 34 reaches or exceeds a predetermined threshold.

Figure 4:
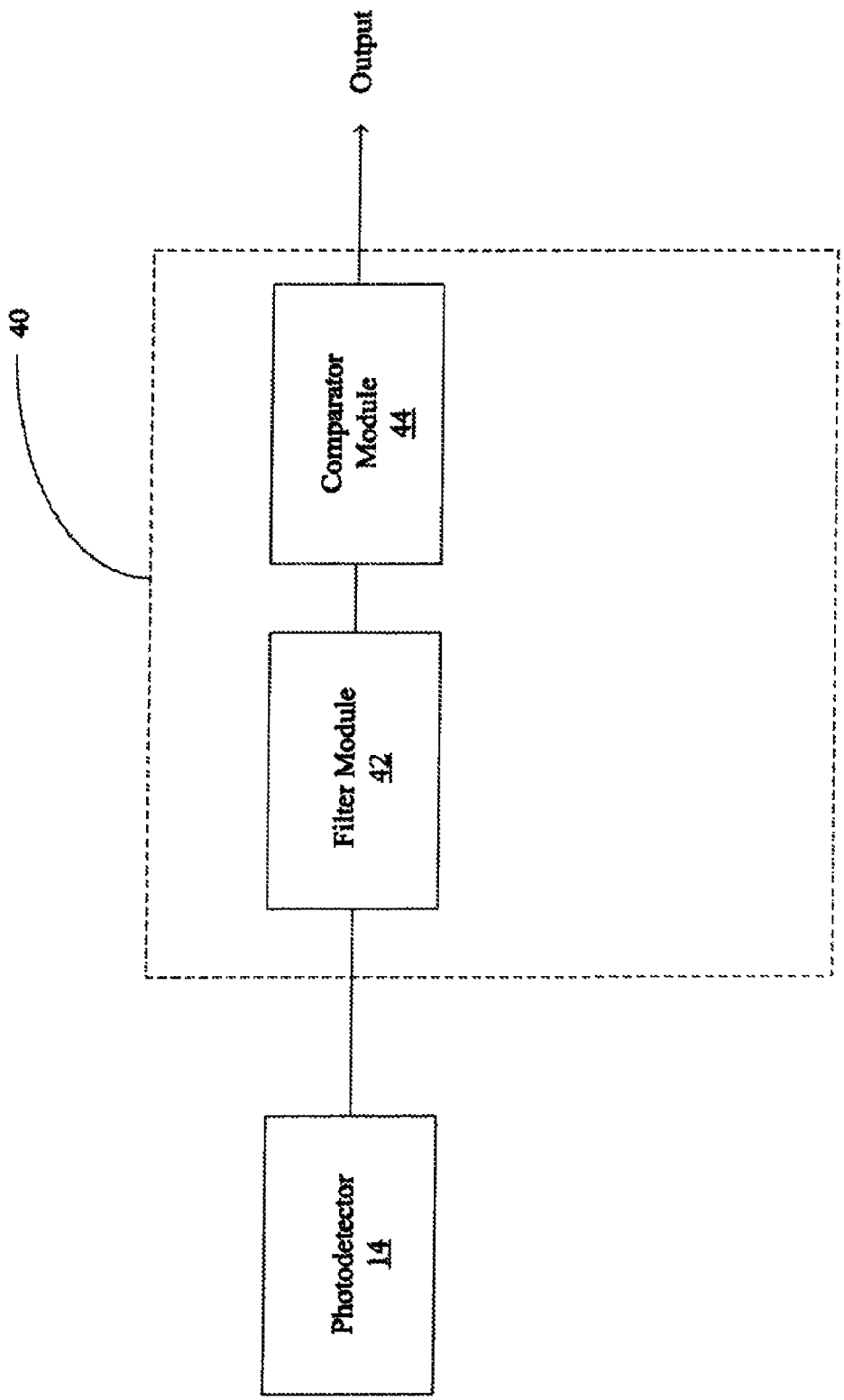
FIG. 4 illustrates various embodiments of a digital signal processor of the system of FIG. 1.
Figure 5:
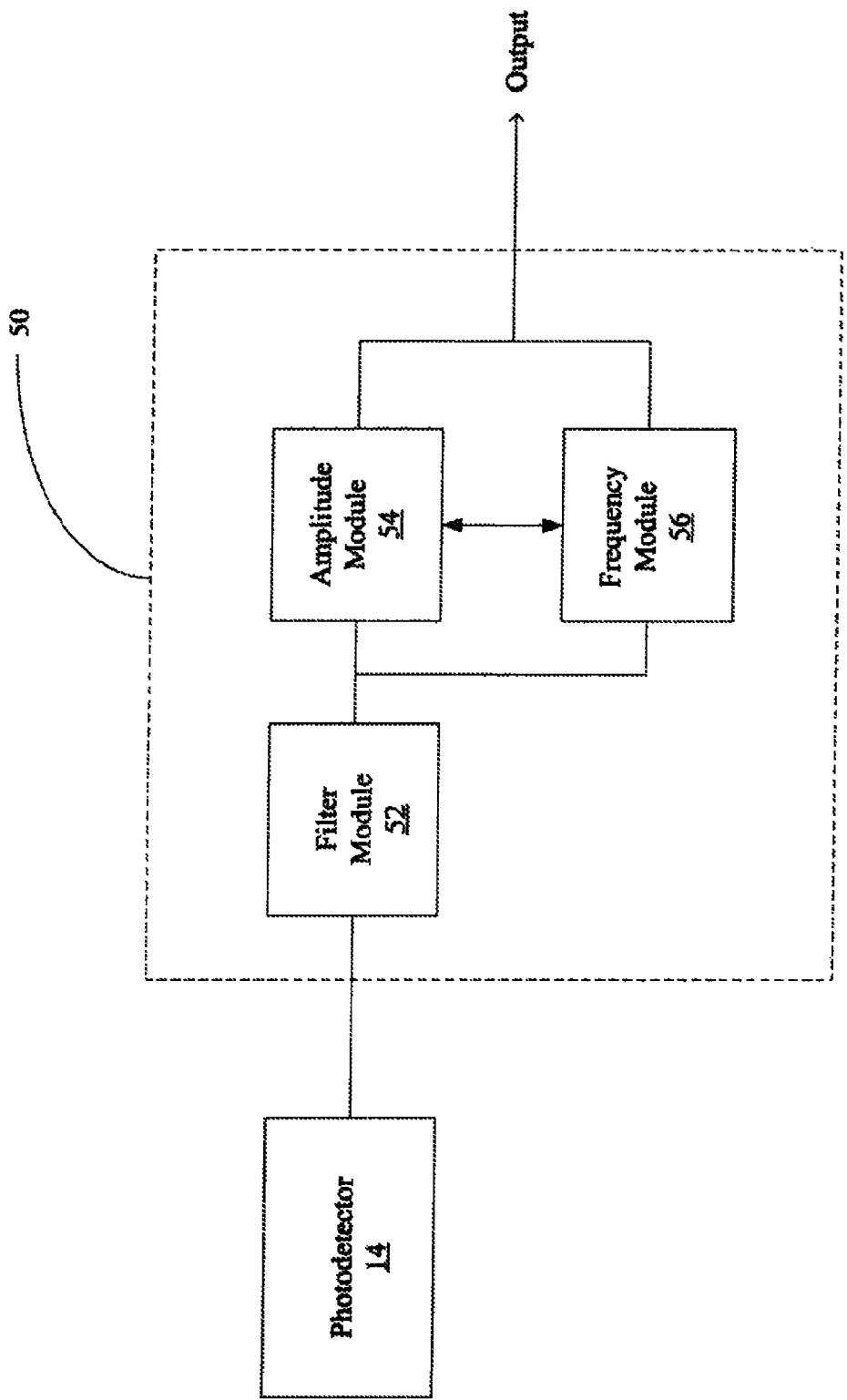
FIG. 5 illustrates various embodiments of a digital signal processor of the system of FIG. 1.

According to other embodiments, the signal processor 16 is implemented as a digital signal processor. Various embodiments of such a digital signal processor are illustrated in FIGS. 4 and 5. The digital signal processor 40 of FIG. 4 includes a filter module 42 and a comparator module 44 in communication with the filter module 42. The filter module 42 is configured to generate a signal representative of the photocurrent component of the signal generated by the photodetector 14. The comparator module 44 is configured to compare a value of the filtered signal to a threshold value, and generate an output based on which of the two values (i.e., the value of the filtered signal or the threshold value) is larger. The modules 42, 44 may be implemented in hardware, in firmware, in software, or in any combination thereof. According to various embodiments, the functionality of the modules 42, 44 may be combined into a single module or distributed over more than two modules.

The digital signal processor 50 of FIG. 5 includes a filter module 52, an amplitude module 54 and a frequency module 56. The filter module 52 is configured to generate a signal representative of the photocurrent component of the signal generated by the photodetector 14. The amplitude module 54 is in communication with the filter module 52, and is configured to analyze the amplitude of the filtered signal. The frequency module 56 is also in communication with the filter module 52, and is configured to analyze the frequency of the filtered signal. Collectively, the amplitude module 54 and the frequency module 56 operate to spectrally break down the filtered signal. By analyzing both the amplitude and frequency of the filtered signal, the digital signal processor 50 may determine the specific type of arcing which has occurred, and generate an output based on the analysis. The modules 52, 54, 56 may be implemented in hardware, in firmware, in software, or in any combination thereof. According to various embodiments, the functionality of the modules 52, 54, 56 may be combined into a single module or distributed over more than three modules.

In some implementations of the system 10, the filtering function may be applied external to the digital signal processors of FIGS. 4 and 5 (e.g., by an RC filter). For embodiments where the signal generated by the photodetector 14 is an analog signal, the system 10 may also include an analog-to-digital converter (not shown) electrically connected to the photodetector 14 and the digital signal processor to convert the analog signal generated by the photodetector 14 to a digital signal which is suitable for the digital signal processor.

Figure 6:
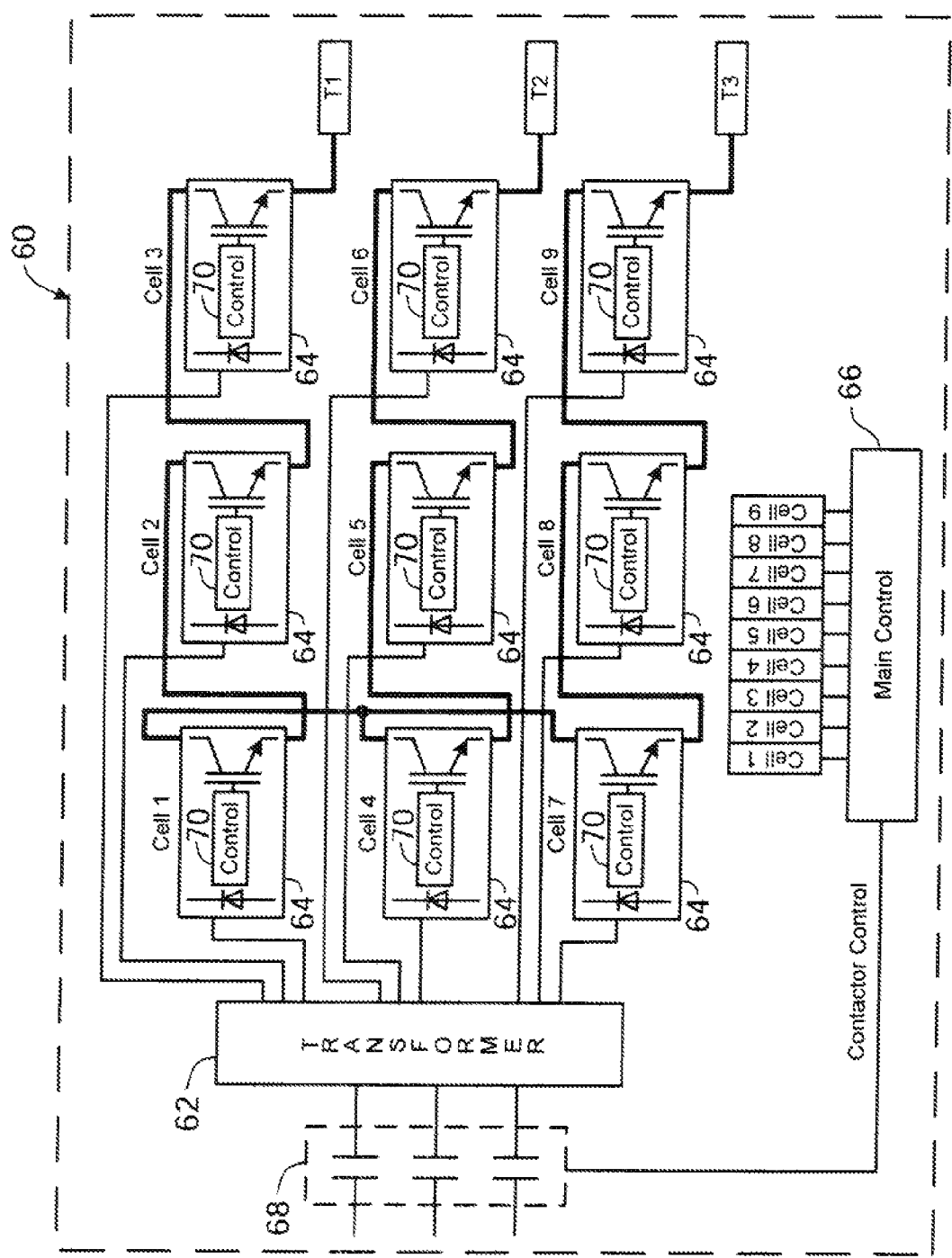
FIG. 6 illustrates various embodiments of a power supply which includes the system of FIG. 1.

FIG. 6 illustrates various embodiments of a power supply 60. The power supply 60 may be similar to the power supply described in the '545 patent. The power supply 60 includes a multi-winding device 62 such as a transformer or a transformer-like device, a plurality of power cells 64 connected to the multi-winding device 62, and a main control 66 connected to each of the power cells 64. The power supply 60 may also include a main contactor 68 which is connected to the power input of the power supply 60, to the multi-winding device 62, and to the main control 66. The main contactor 76 may be a three-phase contactor connected to three power lines of a three-phase distribution system, and may comprise any number of auxiliary contacts as is known in the art. According to various embodiments, the main contactor 68 may be a vacuum contactor, and may be rated for the full current and voltage of a load (e.g., a motor) coupled to the power supply 60.

The power supply 60 may be utilized to deliver a three-phase AC voltage to a motor, and the voltage can vary from application to application. For example, according to various embodiments, the power supply 60 may be utilized to deliver 4160 volts (vac) to the motor, 6600 volts (vac) to the motor, 10,000 volts (vac) to the motor, or other AC voltage levels.

Each power cell 64 is a device which includes an AC-DC rectifier, a smoothing filter, an output DC-to-AC converter, and a local control 70. According to various embodiments, the local control 70 may include for example, the signal processor 16 of FIG. 1. The local control 70 of each power cell 64 is in communication with the main control 66. Each power cell 64 may be constructed to low-voltage standards, accepts three-phase AC input power, and output a single-phase AC voltage. At least one of the power cells 64 of the power supply 60 also includes the system 10 of FIG. 1. For purposes of clarity portions of FIG. 6 are shown in a conventional one-line format, and only some of the components of the power cells 64 (e.g., the local control 70) are shown in FIG. 6. For example, although at least one power cell 64 includes a photodetector 14 and a signal processor 16 as described with respect to the system 10 of FIG. 1, such components are not shown in FIG. 6. Although the power supply 60 is shown as having nine power cells 64 in FIG. 6, one skilled in the art will appreciate that the power supply 60 may include any number of power cells 64, and the number of power cells 64 included in the power supply 60 can vary from application to application.

Figure 7:
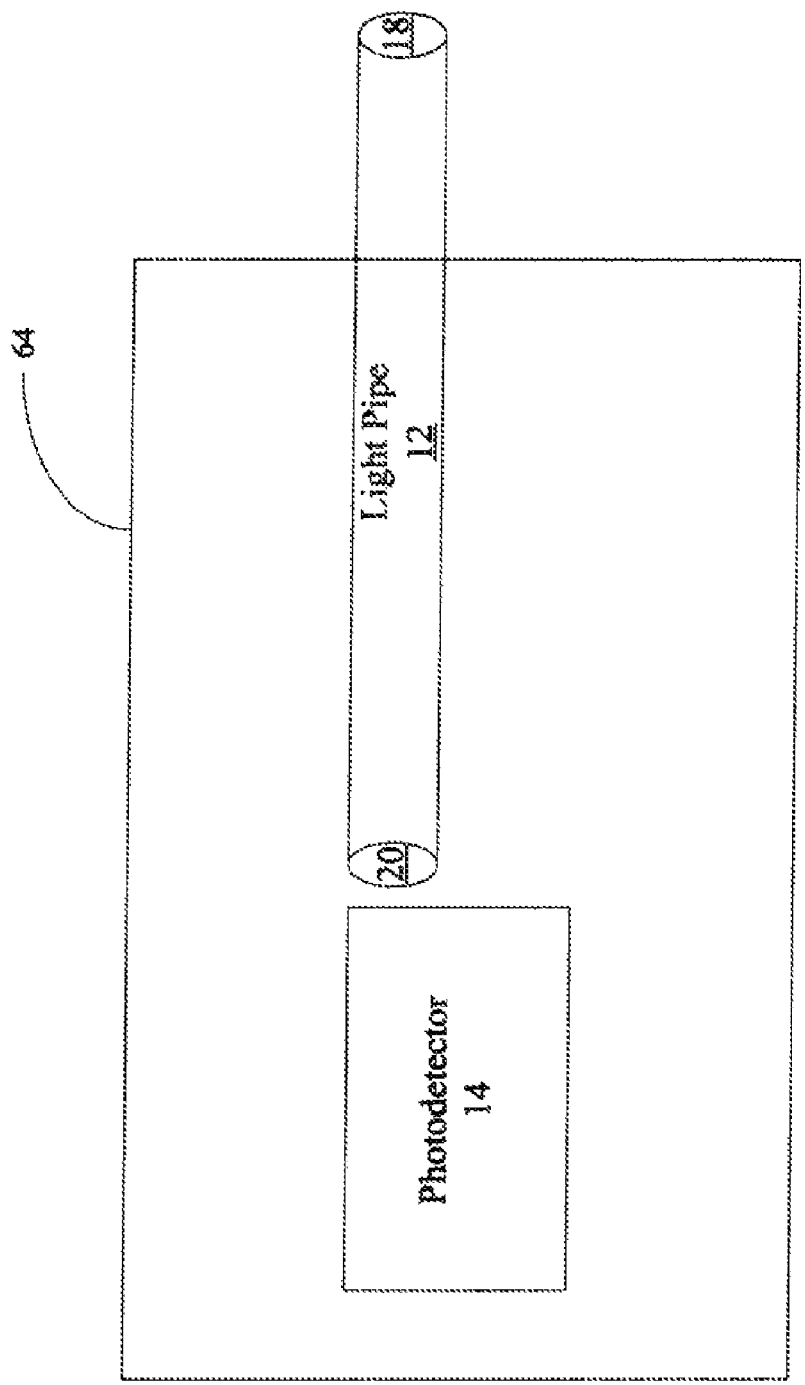
FIG. 7 illustrates various embodiments of a power cell of the power supply of FIG. 6.

FIG. 7 illustrates various embodiments of one of the power cells 64. As shown in FIG. 7, the first end 18 of the light pipe 12 is positioned external to the power cell 64 and the second end 20 of the light pipe 12 is positioned proximate the photodetector 14. As electrical arcs may occur in areas external to the power cell 64, the portion of the light pipe 12 external to the power cell 64 may capture light resulting from such an arc and transmit the light along its length to the photodetector 14. According to other embodiments, the first end 18 of the light pipe 12 is positioned internal to the power cell 64 and the second end 20 of the light pipe 12 is positioned proximate the photodetector 14.

Figure 8:
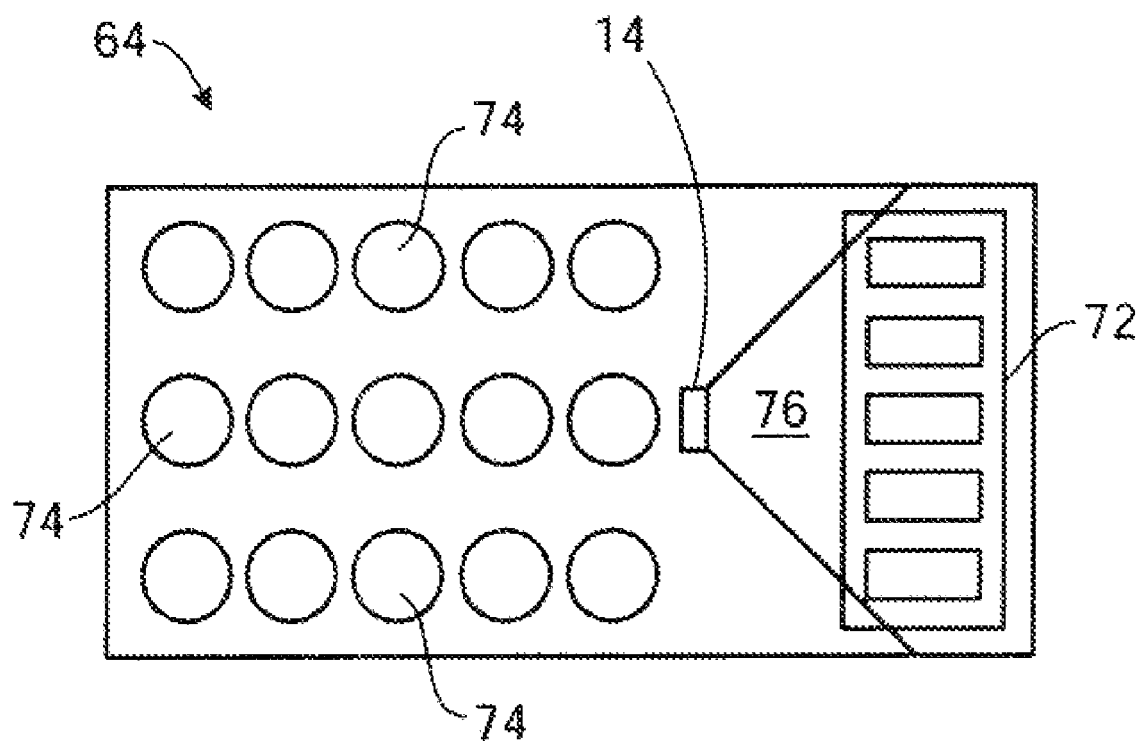
FIG. 8 illustrates various embodiments of a power cell of the power supply of FIG. 6.

FIG. 8 illustrates various embodiments of one of the power cells 64. As shown in FIG. 8, the power cell 64 includes power electronics 72 and a plurality of capacitors 74. The photodetector 14 is positioned to define a field of view 76 within the power cell 64. When positioned in such a manner, the photodetector 14 is able to optically detect an electrical arc occurring at any point within the field of view 76. As electrical arcs are most likely to occur in the area where the power electronics 72 are positioned, and the field of view 76 includes the area where the power electronics 72 are positioned, the photodetector 14 is able to optically detect electrical arcs originating from the power electronics 72, either directly or indirectly via the light pipe 12. For purposes of clarity, the light pipe 12 is not shown in FIG. 8.

Figure 9:
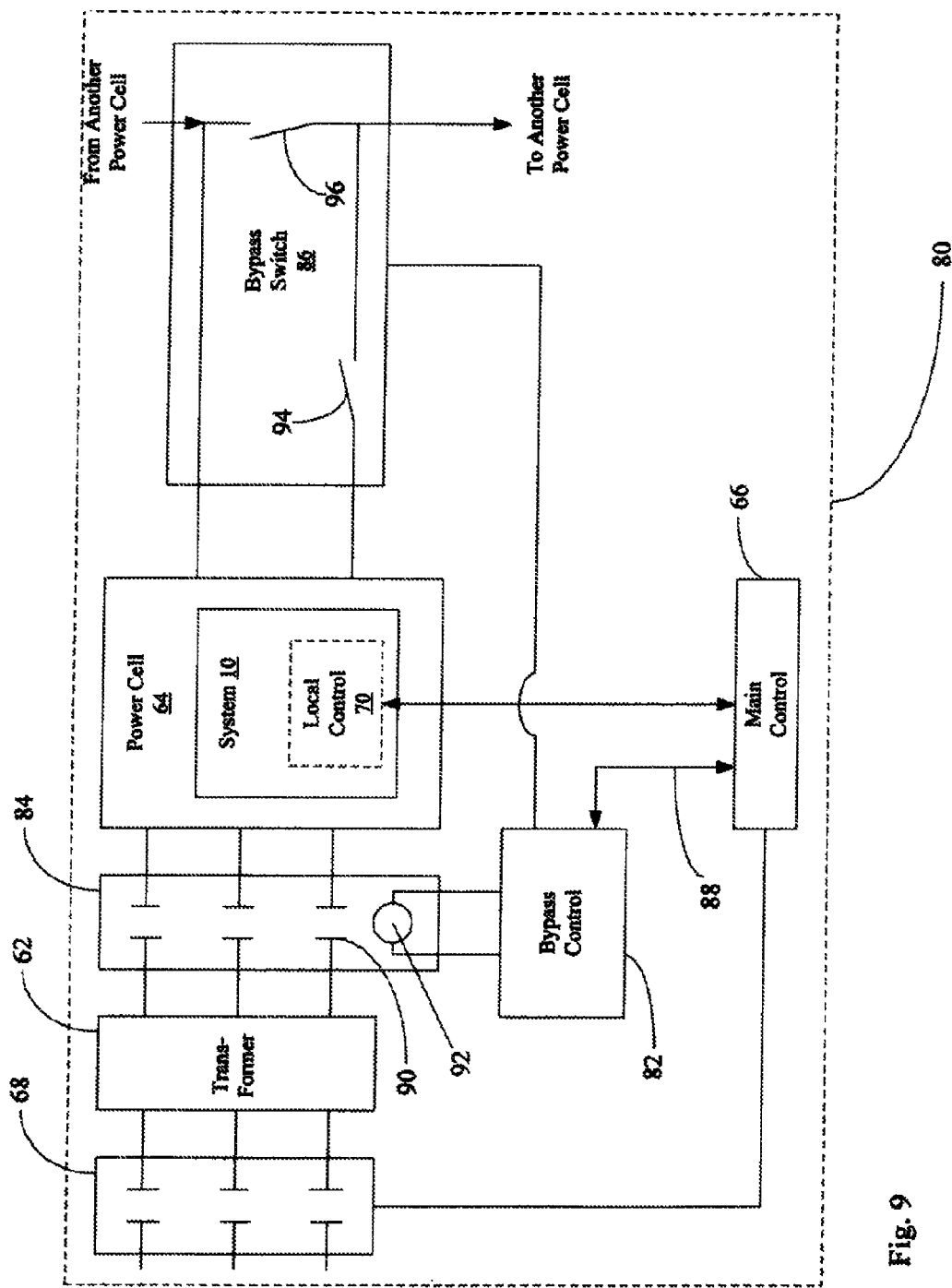
FIG. 9 illustrates various embodiments of a power supply which includes the system of FIG. 1.

FIG. 9 illustrates various embodiments of a power supply 80. The power supply 80 may be similar to the power supply 60 of FIG. 6, but is different in that the power supply 80 may include a bypass control 82, at least one contactor 84 connected to the bypass control 82, and at least one bypass switch 86 connected to the bypass control 82. The at least one contactor 84 and the at least one bypass switch 86 are also connected to an individual power cell 64. According to various embodiments the power cell 80 includes a plurality of contactors 84, wherein each respective contactor 84 is connected to a different power cell 64.

The bypass control 82 and the main control 66 are configured to communicate with one another via communication link 88. Communication link 88 may be embodied as, for example, a wired connection or a fiber optic link. The communications between the main control 66 and the bypass control 82 may be in any suitable form. The bypass control 82 may be implemented in any suitable manner. For example, according to various embodiments, the bypass control 82 is implemented as a programmable logic device. The bypass control 82 is operative to receive a communication from the main control 66, and to transmit a signal to at least one of the contactor 84 and the bypass switch 86 in response thereto. The signal transmitted to the contactor 84 and/or the bypass switch 86 may be a low-voltage signal (e.g., 36 volts). According to various embodiments, the power supply 80 may include a plurality of bypass controls 82, wherein each bypass control 82 is in communication with the main control 66 and is connected to a contactor 84 and/or a bypass switch 86 associated with a particular power cell 64.

According to various embodiments, the contactor 84 includes contacts 90 connected to secondary windings of the multi-winding device 62, and a solenoid 92 connected to the bypass control 82. The number of contacts 90 may vary based on the power supply configuration. The solenoid 92 is operative to open and close each of the contacts 90 responsive to a signal received from the bypass control 82. The contactor 84 may be implemented as a three-phase contactor, and may include any number of auxiliary contacts as is known in the art. According to various embodiments, the contactor 84 may be a vacuum contactor, and may be rated for the full current and voltage of the power cell 64 to which it is connected.

The bypass switch 86 may be implemented in any suitable manner. For example, according to various embodiments, the bypass switch 86 may include a switch 94 connected to the output of the power cell 64, and a switch 96 connected to the output of another power cell which is connected in series with the power cell 64. According to various embodiments, the switches 94, 96 may be interlocked, and the bypass switch 86 may further include device (e.g., a solenoid) operative to open the switch 94 and close the switch 96 responsive to a signal received from the bypass control 82.

Figure 10:
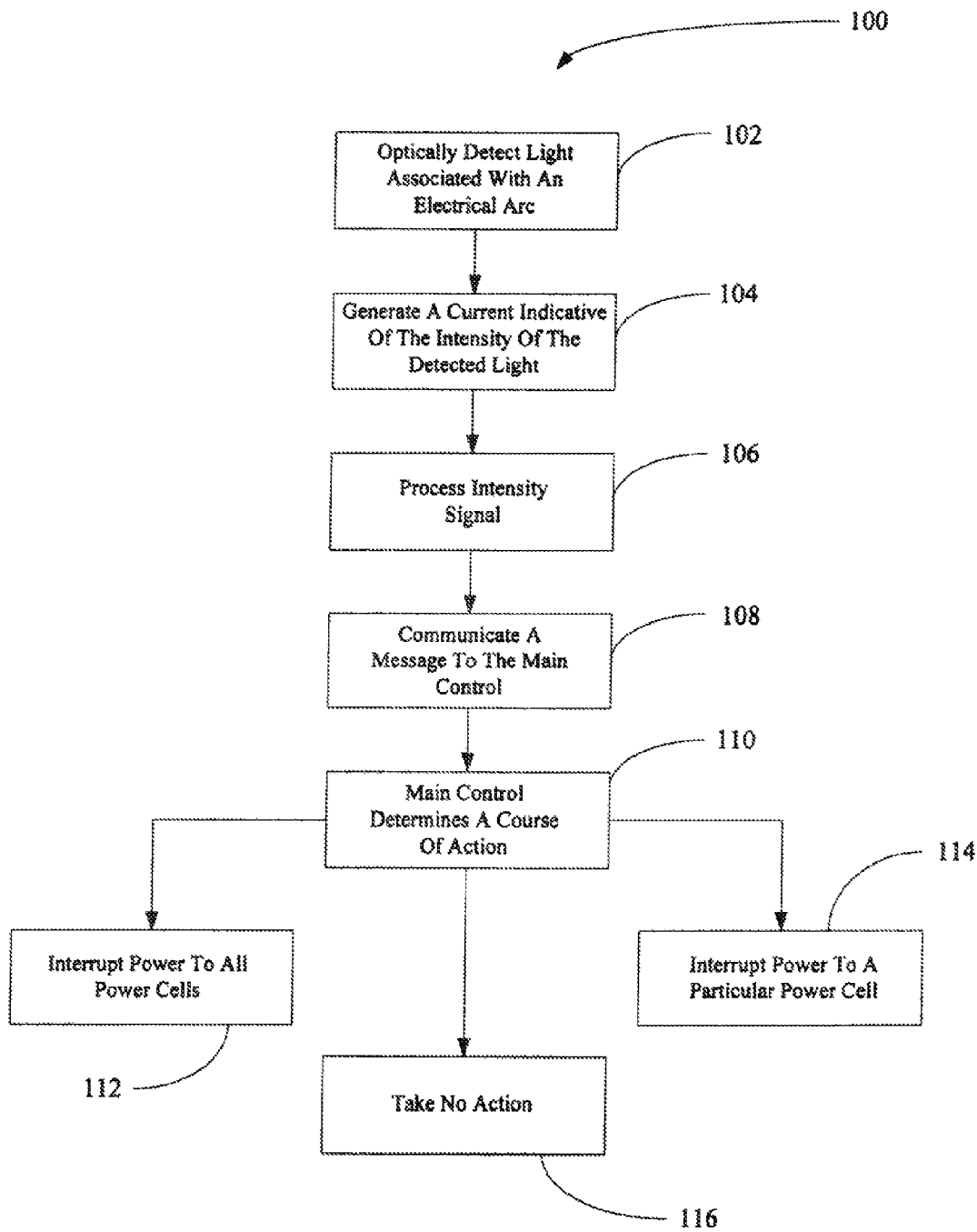
FIG. 10 illustrates various embodiments of a method for optically detecting an electrical arc.

FIG. 10 illustrates various embodiments of a method 100 for optically detecting an electrical arc. The method 100 may be implemented by the system 10 of FIG. 1, and may be utilized to optically detect an electrical arc in a variety of applications. For example, the method 100 may be utilized to optically detect an electrical arc within or external to a power cell in a power supply. For ease of explanation purposes, the method 100 will be described in the context of optically detecting an electrical arc in the power supply 80 of FIG. 9. However, the method 100 may also be utilized to optically detect an electrical arc in other power supplies (e.g., power supply 60 of FIG. 6) and in applications other than a power supply.

The process starts at block 102, where the photodetector 14 optically detects light resulting at least in part from an electrical arc which occurs in the power supply 80. The electrical arc may occur internal to or external to a power cell 64 of the power supply 80. Thus, the light may be optically detected by the photodetector 14 directly or via the light pipe 12.

From block 102, the process advances to block 104, where the photodetector 14 generates a current (i.e., a signal) which is indicative of the intensity of the detected light. The generated current includes a photocurrent component and a dark current component. The photocurrent component is associated with the light resulting from the electrical arc and the dark current component is associated with something other than the electrical arc (e.g., ambient light).

From block 104, the process advances to block 106, where the signal processor 16 receives at least a portion of the signal generated by the photodetector 14, processes the received signal, and generates an output. As described hereinabove, the signal processor 16 may form a portion of the local control 70. The processing of the signal at block 106 may include, for example, filtering the dark current component of the signal generated by the photodetector 14, comparing the signal or the filtered signal to a threshold value, and analyzing the amplitude and/or frequency of the signal or the filtered signal. The output generated by the signal processor 16 may indicate that no arc has been detected, that an arc has been detected, or that a specific type of arc has been detected.

From block 106, the process advances to block 108, where the local control 70 communicates a message to the main control 66. The message may indicate, for example, that no arc has been detected, that an arc has been detected, or that a specific type of arc has been detected.

From block 108, the process advances to block 110, where the main control 66 receives the message and determines an appropriate course of action. The appropriate course of action may be, for example, to interrupt power to all the power cells, to interrupt power to a particular power cell (e.g., the power cell which includes photodetector which detected the presence of the arc), or to take no action.

If the determination made at block 110 is to interrupt power to all of the power cells, the process advances from block 110 to block 112. At block 112, the main control 66 outputs a signal which causes the contactor 68 to interrupt power to the input to the power supply 80, thereby interrupting power to each of the power cells 64.

If the determination made at block 110 is to interrupt power to a particular power cell (e.g., the power cell which includes the photodetector which detected the presence of the arc), the process advances from block 110 to block 114. At block 114, the bypass control 82 receives the interrupt message, processes the interrupt message, and sends an interrupt signal to the contactor 84 associated with the particular power cell 64. The interrupt signal causes power to be interrupted to the particular power cell 64. Additionally, the bypass control 82 may also send a bypass signal to the bypass switch 86 associated with the particular power cell 64. The bypass signal causes the switch 94 to open and the switch 96 to close, thereby preventing the particular power cell 64 from contributing to the output voltage of the power supply 80 while allowing the power supply 80 to remain operational.

If the determination made at block 110 is to take no further action, the process advances from block 110 to block 116. At block 116, the method 100 then waits for the next electrical arc to occur. The process flow described hereinabove may be repeated any number of times while the power supply 80 is operational.

While several embodiments of the invention have been described herein by way of example, those skilled in the art will appreciate that various modifications, alterations, and adaptions to the described embodiments may be realized without departing from the spirit and scope of the invention defined by the appended claims.

What is claimed is:

1. A method for optically detecting an electrical arc in a power supply having a plurality of cells, the method comprising:
    capturing light at a first cell with at least one light pipe, wherein the light pipe is positioned such that a first portion of the light pipe is external to the first cell to capture light that may occur from an external electrical arc and a second portion of the light pipe is inside the cell to capture light that may occur from an internal electrical arc within the first cell;
    transmitting the captured light along at least a portion of a length of the light pipe;
    optically detecting the transmitted light with a photodetector which is optically coupled to the light pipe;
    generating a signal indicative of an intensity of the detected light;
    converting the generated signal to a digital signal; and
    determining whether the detected light is associated with an electrical arc.

2. The method of claim 1, wherein capturing the light comprises capturing the light at an end of the light pipe.

3. The method of claim 1, wherein capturing the light comprises capturing the light along the length of the light pipe.

4. The method of claim 1, wherein transmitting the captured light along at least the portion of the length of the light pipe comprises transmitting the captured light to an end of the light pipe.

5. The method of claim 1, wherein generating the signal comprises generating a current indicative of an intensity of the detected light.

6. The method of claim 1, wherein determining whether the detected light is associated with the electrical arc comprises comparing a value of at least a portion of the generated signal with a threshold value.

7. The method of claim 1, further comprising filtering the generated signal.

8. The method of claim 1, further comprising determining whether the detected light is associated with a particular type of electrical arc.

9. The method of claim 8, wherein determining whether the detected light is associated with a particular type of electrical arc comprises analyzing an amplitude of at least a portion of the generated signal.

10. The method of claim 8, wherein determining whether the detected light is associated with a particular type of electrical arc comprises analyzing a frequency of at least a portion of the generated signal.

11. The method of claim 1, further comprising interrupting power to a the first cell when it is determined that the detected light is associated with the electrical arc.

12. The method of claim 11, further comprising electrically disconnecting an output of the first cell from a circuit which is connected to an output of at least one other power cell of the power supply.

13. The method of claim 1, further comprising interrupting power to each power cell of the power supply when it is determined that the detected light is associated with the electrical arc.

14. A method for optically detecting an electrical arc in a power supply having a plurality of cells, the method comprising:
    capturing light at a first cell with at least one light pipe, wherein the light pipe is positioned such that a first portion of the light pipe is external to the first cell to capture light that may occur from an external electrical arc and a second portion of the light pipe is inside the cell to capture light that may occur from an internal electrical arc within the first cell;
    transmitting the captured light along at least a portion of a length of the light pipe;
    optically detecting the transmitted light with a photodetector which is optically coupled to the light pipe;
    generating a signal indicative of an intensity of the detected light;
    determining whether the detected light is associated with an electrical arc; and
    determining whether the detected light is associated with a particular type of electrical arc.

15. The method of claim 14, wherein determining whether the detected light is associated with a particular type of electrical arc comprises analyzing an amplitude of at least a portion of the generated signal.

16. The method of claim 14, wherein determining whether the detected light is associated with a particular type of electrical arc comprises analyzing a frequency of at least a portion of the generated signal.

17. The method of claim 14, further comprising converting the generated signal to a digital signal.

18. A method for optically detecting an electrical arc in a power supply having a plurality of cells, the method comprising:
    capturing light at a first cell with at least one light pipe, wherein the light pipe is positioned such that a first portion of the light pipe is external to the first cell to capture light that may occur from an external electrical arc and a second portion of the light pipe is inside the cell to capture light that may occur from an internal electrical arc within the first cell;

transmitting the captured light along at least a portion of a length of the light pipe;

optically detecting the transmitted light with a photodetector which is optically coupled to the light pipe;

generating a signal indicative of an intensity of the detected light;

determining whether the detected light is associated with an electrical arc; and determining whether the detected light is associated with a particular type of electrical arc by analyzing either an amplitude or a frequency of at least a portion of the generated signal.

\* \* \* \* \*